(12) United States Patent
Huebinger et al.

(10) Patent No.: US 7,687,862 B2
(45) Date of Patent: Mar. 30, 2010

(54) SEMICONDUCTOR DEVICES WITH ACTIVE REGIONS OF DIFFERENT HEIGHTS

(75) Inventors: Frank Huebinger, Poughkeepsie, NY (US); Richard Lindsay, Beacon, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/120,055

(22) Filed: May 13, 2008

(65) Prior Publication Data

US 2009/0283837 A1 Nov. 19, 2009

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 27/10 | (2006.01) |
| H01L 27/12 | (2006.01) |
| H01L 31/0392 | (2006.01) |
| H01L 23/62 | (2006.01) |

(52) U.S. Cl. .................. 257/369; 257/331; 257/338; 257/341; 257/342; 257/350; 257/351; 257/357; 257/358; 257/359; 257/371; 257/401; 257/E21.623; 257/E21.637; 257/E21.553

(58) Field of Classification Search .................. 257/331, 257/338, 341–342, 350–351, 357–359, 369, 257/371, 401, E21.623, E21.637, E21.553
See application file for complete search history.

(56) References Cited

U.S. PATENT DOCUMENTS

| | | | | |
|---|---|---|---|---|
| 4,868,135 A | * | 9/1989 | Ogura et al. ................ 438/203 |
| 4,948,745 A | * | 8/1990 | Pfiester et al. .............. 438/290 |
| 5,166,082 A | * | 11/1992 | Nakamura et al. .......... 438/234 |
| 5,479,033 A | * | 12/1995 | Baca et al. .................. 257/192 |
| 5,888,853 A | * | 3/1999 | Gardner et al. .............. 438/152 |
| 6,531,376 B1 | * | 3/2003 | Cai et al. ..................... 438/422 |
| 6,653,181 B2 | * | 11/2003 | Hergenrother et al. ...... 438/206 |
| 6,940,129 B2 | * | 9/2005 | Kim et al. .................... 257/347 |
| 7,221,056 B2 | * | 5/2007 | Yamamoto et al. .......... 257/763 |
| 7,368,333 B2 | * | 5/2008 | Kim .......................... 438/149 |
| 7,381,989 B2 | * | 6/2008 | Kim et al. ..................... 257/67 |
| 7,384,849 B2 | * | 6/2008 | Parekh et al. ................ 438/270 |
| 7,432,185 B2 | * | 10/2008 | Kim et al. .................... 438/597 |
| 7,514,313 B2 | * | 4/2009 | Zia et al. ..................... 438/218 |
| 7,550,343 B2 | * | 6/2009 | Wasshuber ................... 438/221 |
| 2005/0127408 A1 | * | 6/2005 | Doris et al. .................. 257/288 |
| 2005/0133874 A1 | * | 6/2005 | Goda et al. .................. 257/374 |
| 2005/0275021 A1 | * | 12/2005 | Matsumoto et al. ......... 257/347 |

(Continued)

OTHER PUBLICATIONS

Seidel, H., et al., "Anisotropic Etching of Crystalline Silicon in Alkaline Solutions: II. Influence of Dopants," J. Electrochem. Soc., Nov. 1990, pp. 3626-3632, vol. 137, No. 11, The Electrochemical Society, Inc., Pennington, NJ.

Primary Examiner—Ida M Soward
(74) Attorney, Agent, or Firm—Slater & Matsil, L.L.P.

(57) ABSTRACT

Semiconductor devices and methods of manufacture thereof are disclosed. In one embodiment, a semiconductor device includes a first transistor having a first active area, and a second transistor having a second active area. A top surface of the first active area is elevated or recessed with respect to a top surface of the second active area, or a top surface of the first active area is elevated or recessed with respect to a top surface of at least portions of an isolation region proximate the first transistor.

12 Claims, 6 Drawing Sheets

U.S. PATENT DOCUMENTS

| | | | |
|---|---|---|---|
| 2006/0102959 A1* | 5/2006 | Kim et al. | 257/369 |
| 2006/0278933 A1* | 12/2006 | Endo | 257/369 |
| 2007/0069293 A1* | 3/2007 | Kavalieros et al. | 257/350 |
| 2007/0132034 A1* | 6/2007 | Curello et al. | 257/374 |
| 2007/0218659 A1* | 9/2007 | Spencer et al. | 438/497 |
| 2007/0267753 A1* | 11/2007 | Luo et al. | 257/773 |
| 2008/0023769 A1* | 1/2008 | Shin et al. | 257/364 |
| 2008/0128807 A1* | 6/2008 | Fukushima et al. | 257/347 |
| 2008/0199990 A1* | 8/2008 | Parekh | 438/151 |
| 2008/0237733 A1* | 10/2008 | Chen et al. | 257/374 |
| 2008/0274594 A1* | 11/2008 | Karve et al. | 438/153 |
| 2008/0274595 A1* | 11/2008 | Spencer et al. | 438/154 |
| 2008/0283934 A1* | 11/2008 | Luo et al. | 257/384 |
| 2008/0308872 A1* | 12/2008 | Bu et al. | 257/369 |
| 2009/0173980 A1* | 7/2009 | Cheng et al. | 257/301 |
| 2009/0218632 A1* | 9/2009 | Cheng | 257/369 |

* cited by examiner

SEMICONDUCTOR DEVICES WITH ACTIVE REGIONS OF DIFFERENT HEIGHTS

TECHNICAL FIELD

The present invention relates generally to the fabrication of semiconductor devices, and more particularly to manufacturing transistors.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon, forming an integrated circuit (IC).

A transistor is an element that is used frequently in semiconductor devices. There may be millions of transistors on a single IC, for example. A common type of transistor used in semiconductor device fabrication is a metal oxide semiconductor field effect transistor (MOSFET), as an example. A transistor typically includes a gate dielectric disposed over a channel region in a substrate, and a gate electrode formed over the gate dielectric. A source region and a drain region are formed on either side of the channel region within the substrate.

Complementary metal oxide semiconductor (CMOS) devices utilize both p type and n type channel transistor devices in complementary configurations. The p type and n type transistor devices of CMOS devices are typically referred to as p channel metal oxide semiconductor (PMOS) field effect transistors (PFETs) and n channel metal oxide semiconductor (NMOS) field effect transistors (NFETs), for example. A PFET is formed in an n well (e.g., a well implanted with n type dopants) and an NFET is formed in a p well. An isolation region such as a shallow trench isolation (STI) region is formed between the n well and p well of the PFET and the NFET, respectively, to electrically isolate the active device regions.

What are needed in the art are improved methods of fabricating CMOS devices and other semiconductor devices comprising transistor devices, and structures thereof.

SUMMARY OF THE INVENTION

These and other problems are generally solved or circumvented, and technical advantages are generally achieved, by embodiments of the present invention, which provide novel semiconductor devices, CMOS devices, and methods of fabrication thereof.

In accordance with an embodiment of the present invention, a semiconductor device includes a first transistor having a first active area, and a second transistor having a second active area. A top surface of the first active area is elevated or recessed with respect to a top surface of the second active area, or a top surface of the first active area is elevated or recessed with respect to a top surface of at least portions of an isolation region proximate the first transistor.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

CMOS devices and other semiconductor devices comprising transistors can be challenging to manufacture. For example, in CMOS devices, PFET and NFET devices have different operating characteristics and parameters. NFETs tend to have more junction leakage than PFETs, due to different behaviors of the dopants used. It can be difficult to tune processing parameters of both PFET and NFET transistors and optimize performance of a CMOS device, for example.

As one example, in some CMOS devices and applications, it may be desirable in some applications for active areas to be elevated of some transistors, such as PFETs, with respect to isolation regions, in order to maximize device performance of the PFETs. Elevating active areas of PFETs would result in a wrap-around of a gate dielectric and gate deposited over the active area, increasing an effective width of the gate, because of the additional surface area of the gate material over the channel region. However, elevating active areas of other transistors such as NFETs in the same CMOS device may result in high junction leakage and degradation of device performance of the NFETs. Thus, recessing isolation regions for all types of transistors of CMOS devices may not be possible in some applications.

Embodiments of the present invention provide novel integration schemes for selectively recessing isolation regions proximate active areas of PFETs, but not proximate active areas of NFETs of CMOS devices. Several methods will be described herein that provide optimization of performance for both PFETs and NFETs of CMOS devices. Embodiments of the present invention may also be implemented in semiconductor devices comprising other types of transistors, to be described further herein. Embodiments of the present invention may also be used to form multiple gate transistors in some regions of a semiconductor device, but not others, also to be described further herein. Integration schemes are also disclosed wherein isolation regions are elevated proximate active areas of some transistors, but not proximate active areas of other transistors, or wherein isolation regions are more elevated proximate active areas of some transistors than proximate active areas of other transistors.

Embodiments of the present invention provide novel semiconductor devices that comprise transistors with elevated or recessed active areas in some regions with respect to isolation regions, yet the active areas of transistors in other regions are not elevated or recessed, but rather, may be substantially coplanar with the isolation regions. Embodiments of the present invention also provide semiconductor device wherein top surfaces of active areas of some transistors are elevated or recessed with respect to active areas of other transistors. For example, embodiments of the present invention include semiconductor devices wherein a first transistor comprises a first active area, and a second transistor comprises a second active area. A top surface of the first active area is elevated or recessed with respect to a top surface of the second active area.

The present invention will be described with respect to embodiments in a specific context, namely, in the formation of CMOS devices. Embodiments of the present invention may also be applied, however, to other semiconductor devices that utilize more than one type of transistor.

Figure 1:
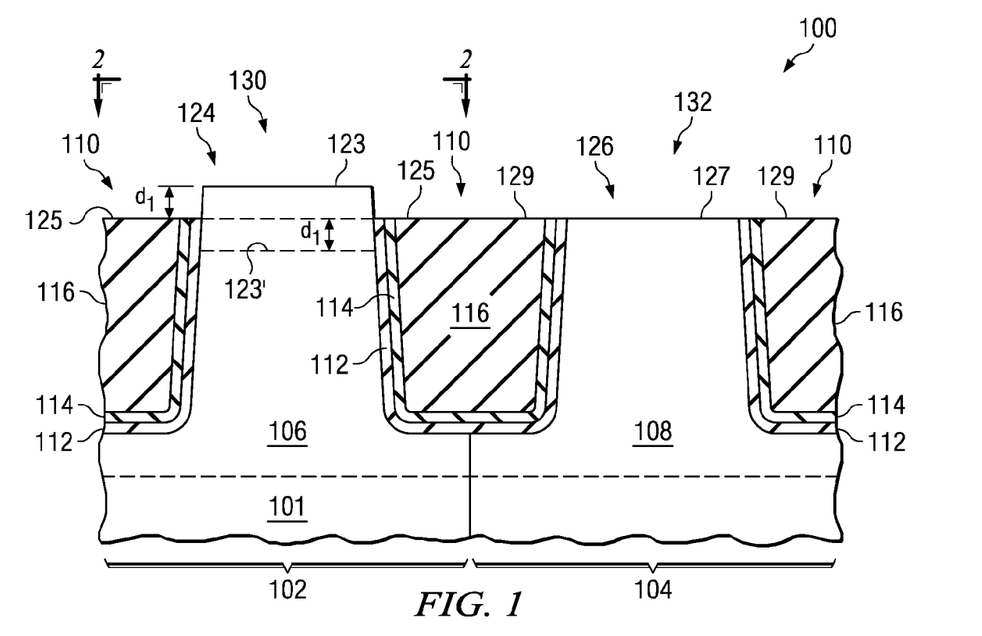
FIG. 1 shows a cross-sectional view of a semiconductor device comprising a first transistor and a second transistor in accordance with an embodiment of the present invention, wherein a top surface of an active area of the first transistor, but not the second transistor, is elevated (or recessed, shown in phantom) with respect to a top surface of isolation regions disposed proximate the first transistor and the second transistor.

Embodiments of the present invention will next be described with reference to FIGS. 1 through 12. Referring first to FIG. 1, a cross-sectional view of a semiconductor device 100 is shown. The semiconductor device 100 includes a workpiece 101 comprising a semiconductor substrate, body, or wafer comprising silicon or other semiconductor materials, for example. The workpiece 101 may also include other active components or circuits, not shown. The workpiece 101 may comprise single-crystal silicon, for example. The workpiece 101 may include other conductive layers or other semiconductor elements, e.g., transistors, capacitors, diodes, etc. Compound semiconductors, GaAs, InP, Si/Ge, or SiC, as examples, may be used in place of silicon. The workpiece 101 may comprise a silicon-on-insulator (SOI) substrate or germanium-on-insulator (GOI) substrate, as examples.

The workpiece 101 comprises a first region 102 and a second region 104 proximate the first region 102. There may be a plurality of first regions 102 and second regions 104 across a surface of the workpiece 101, for example, not shown. The semiconductor device 100 includes a first transistor 130 in the first region 102 and a second transistor 132 in the second region 104. In some embodiments, the first transistor 130 comprises a PFET formed over a first well region 106, and the second transistor 132 comprises an NFET formed over a second well region 108. The first well region 106 may comprise an n well, and the second well region 108 may comprise a p well, if the transistors 130 and 132 comprise a PFET and an NFET of a CMOS device. Alternatively, the first and second transistors 130 and 132 may comprise other types of transistors, for example. The second transistor 130 may comprise a different type of transistor than the first transistor 132, to be described further herein.

Alternatively, the well regions 106 and 108 may both comprise n wells and/or p wells, for example, implanted with the same or different dopant types or the same or different dopant concentrations, for example. Alternatively, the first well region 106 may comprise a p well, and the second well region 108 may comprise an n well, as another example.

The view shown in FIG. 1 comprises a cross-sectional view cut through a source or drain region 124 and 126 of the transistors 130 and 132. Source and drain regions 124 and 126 of the first transistor 130 and the second transistor 132 will later be formed in a top portion of the first well region 106 and second well region 108, respectively, for example.

Isolation regions 110 are disposed in a top portion of the workpiece 101. At least one isolation region 110 is formed between the first well region 106 of the first transistor 130 and the second well region 108 of the second transistor 132. The isolation regions 110 may be formed by forming trenches in the workpiece 101 and forming at least one insulating material in the trenches.

The isolation regions 110 may comprise one or more insulating liners 112 and 114 disposed within and lining the trenches, and a fill material 116 formed over the liners 112 and 114. The liners 112 and 114 may comprise at least one insulating liner comprising an oxide material layer, a nitride material layer, or combinations or multiple layers thereof. The fill material 116 may comprise an insulator or a semiconductive material, as examples. Alternatively, the liners 112 and 114 and fill material 116 may comprise other materials. The isolation regions 110 alternatively may comprise a single material comprising an insulating fill material and may not comprise a liner, for example.

The source and/or drain region 124 and a channel region 128a that will later be formed in the first well region 106 (see the top view of FIG. 2) comprise an active area 124/128a of the first transistor 130. The active area 124/128a of the first transistor 130 is also referred to herein as a first active area 124/128a. The source and/or drain region 126 and a channel region 128b that will later be formed in the second well region 108 (see the cross-sectional view of FIG. 4) comprise an active area 126/128b of the second transistor 132. The active area 126/128b of the second transistor 132 is also referred to herein as a second active area 126/128b.

In accordance with some embodiments of the present invention, the top surface 123 of the active area 124/128a of the first transistor 130, but not the top surface 127 of the active area 126/128b of the second transistor 132, is elevated (or recessed, shown in phantom at 123'), with respect to top surface 125 and/or top surface 129 of isolation regions 110 disposed proximate the first transistor 130 and the second transistor 132, respectively, creating a step height. The top surfaces 123 or 123' of the active area of the first transistor 130 may be elevated or recessed by an amount or dimension $d_1$, for example, wherein dimension $d_1$ comprises about +/−100 nm or less in some embodiments. In some applications, the step height or dimension $d_1$ may comprise about +/−5 to 10 nm, as another example. Alternatively, dimension $d_1$ may comprise other values, depending on the technology and/or the transistor 130 requirements. The elevated active area of the first transistor 130 may improve the performance of the first transistor 130 in some embodiments, to be described further herein.

In other embodiments, dimension $d_1$ of the step height may comprise about 100 nm or greater. For example, the novel methods to be described herein may be used to form multiple gate transistors 130 such as FinFETs in some regions of the semiconductor device 100. The multiple gate transistors 130 may comprise an active area comprising a dimension $d_1$ above the top surface of the workpiece 101 by several hundred nm to several μm in these embodiments, for example. Embodiments of the present invention may be used to create FinFETs or other multiple gate transistors 130 on the same chip as planar transistors 132, to be described further herein.

Figure 2:
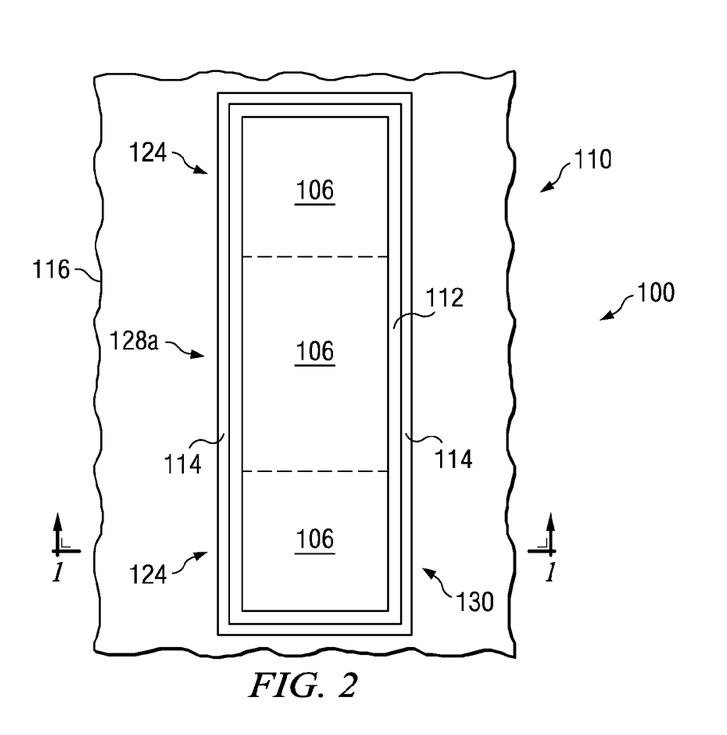
FIG. 2 shows a top view of the active area of the first transistor of the semiconductor device shown in FIG. 1.

FIG. 2 shows a top view of the first transistor 130 of the semiconductor device 100 shown in FIG. 1 in the view at 2-2, illustrating the active area 124/128a of the first transistor 130. The first well region 106 comprises an area where source and drain regions 124 will later be formed. A channel region 128a will later be formed between the source region and drain regions 124. The source and drain regions 124 and channel region 128a will later be formed within the first well region 106 of the first transistor 130, for example. The source and drain regions 124, shown as first well regions 106 in FIG. 2, may not terminate at the top and bottom as shown in FIG. 2, but may be larger and may extend vertically downwards and upwards to route to an adjacent transistor, for example, not shown.

Figure 3:
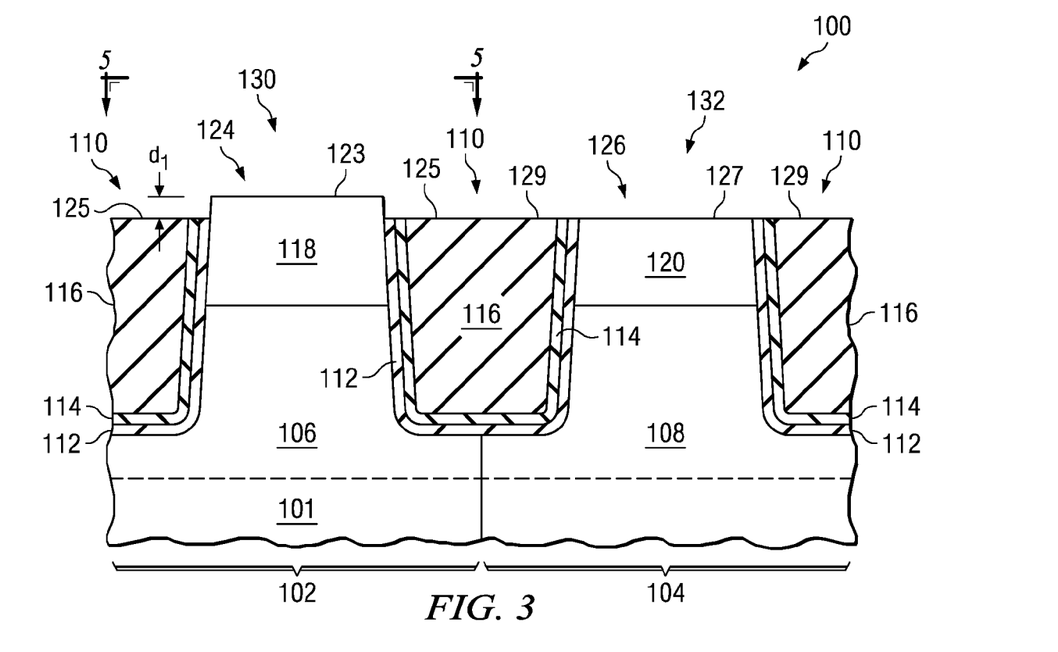
FIG. 3 shows a cross-sectional view of the semiconductor device shown in FIG. 1 after the formation of semiconductive regions of source and drain regions of the active areas.
Figure 4:
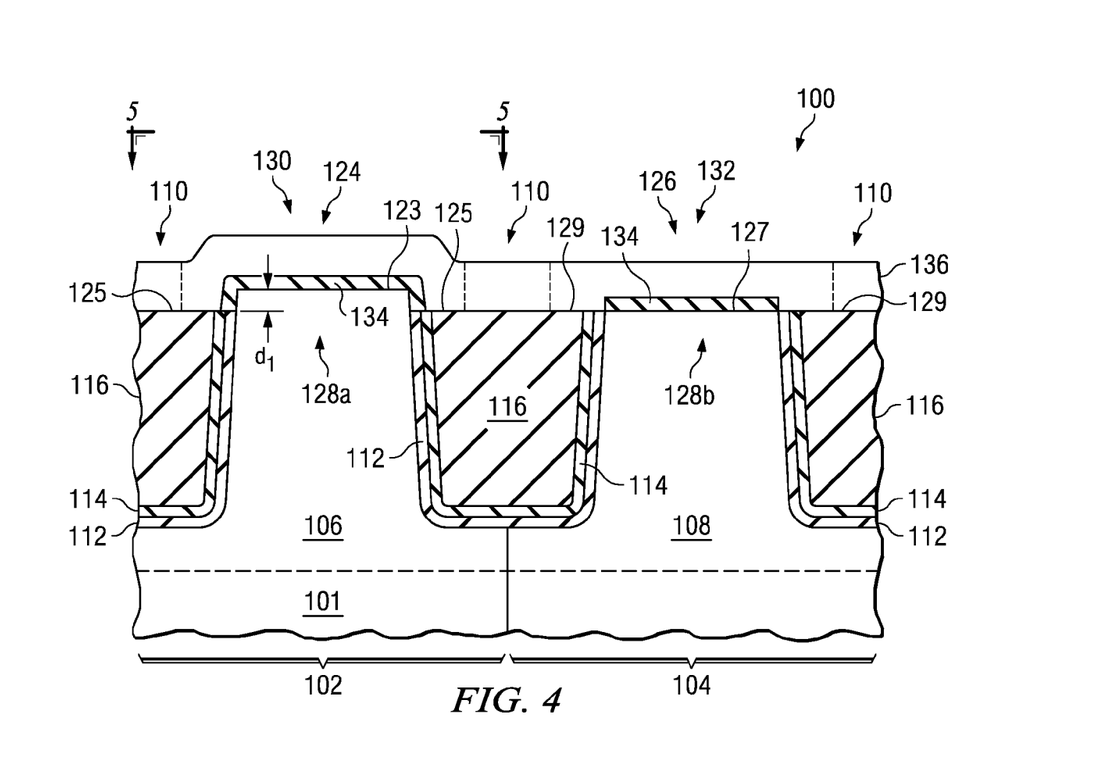
FIG. 4 shows a cross-sectional view of the semiconductor device shown in FIG. 1 after the formation of a gate dielectric and gate on the first and second transistors, illustrating a gate wrap-around effect of the first transistor due to the elevated active area, which increases device performance.
Figure 5:
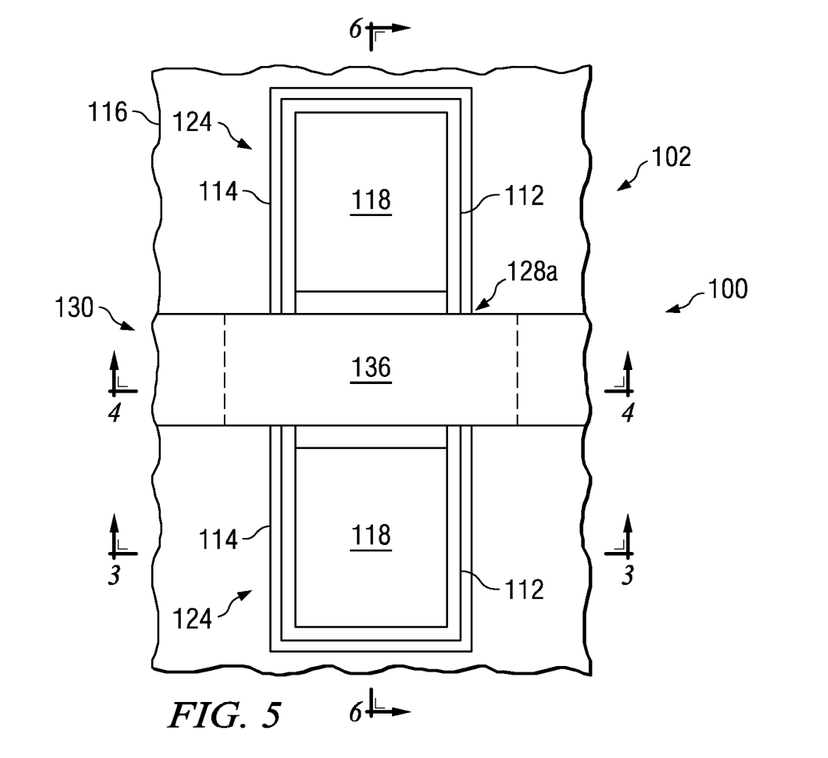
FIG. 5 shows a top view of the first transistor of the semiconductor device shown in FIGS. 3 and 4.

Next, a gate dielectric material 134 and a gate material 136 are formed over the workpiece 101, and the gate material 136 and the gate dielectric material 134 are patterned using lithography, forming a gate 136 and a gate dielectric 134 over the channel regions 128a and 128b, as shown in a cross-sectional view in FIG. 4 and in a top view in FIG. 5. Then, the source and drain regions 124 and 126 are formed, as shown in FIG. 3.

FIG. 3 shows a cross-sectional view of the semiconductor device 100 shown in FIG. 1, after a semiconductive region 118 is formed within the first well region 106 of the first transistor 130 and after a semiconductive region 120 is formed within the second well region 108 of the second transistor 132. The semiconductive region 118 of the first transistor 130 may comprise a p+ material 118, and the semiconductive region 120 of the second transistor 132 may comprise an n+ material 120, if the first transistor 130 comprises a PFET and the second transistor 132 comprises an NFET. Alternatively, the semiconductive regions 118 and 120 of the source and drain regions 124 and 126, respectively, may comprise other types of materials.

FIG. 3 shows a cross-sectional view of the transistors 130 and 132 of semiconductor device 100 proximate the source or drain regions 124 and 126, respectively, for example. The conductive materials 118 and 120 of the transistors 130 and 132 may be formed using implantation processes, deposition processes, or epitaxial growth processes, for example. The conductive materials 118 and 120 may comprise a stress material such as embedded SiGe or other compound semiconductor material adapted to introduce a stress to the adjacent channel regions 128a and 128b, for example. The conductive materials 118 and 120 may both comprise p+ material or n+ material in some embodiments. The conductive materials 118 and 120 form the source and drain regions 124 and 126 of the first and second transistors 130 and 132, respectively.

An optional silicide (not shown) may later be formed over the p+ material 118 and the n+ material 120, for example. The optional silicide and the p+ material 118 may comprise a source and/or drain region 124 of the first transistor 130, and the silicide and the n+ material 120 may comprise a source and/or drain region 126 of the second transistor 132.

FIG. 4 shows a cross-sectional view of the transistors 130 and 132 of semiconductor device 100 proximate the gate 136 and channel 128a and 128b regions. A gate dielectric 134 is formed over the channel regions 128a and 128b and may be formed using an oxidation process, for example. Alternatively, the gate dielectric 134 may be deposited, e.g., if the gate dielectric 134 comprises a high dielectric constant k material. The gate 136 is formed over the gate dielectric 134 of the first and second transistors 130 and 132. The gate dielectric 134 and gate 136 wrap around the first transistor 130, e.g., in a vertical direction, due to the elevated active area 124/128a of the first transistor 130 over the channel region 128 in some embodiments, which increases device 100 performance in some embodiments. The gates 136 may extend horizontally across the workpiece 101, or the gates 136 may be patterned in each region 102 and 104, as shown in phantom in FIGS. 4 and 5.

Figure 6:
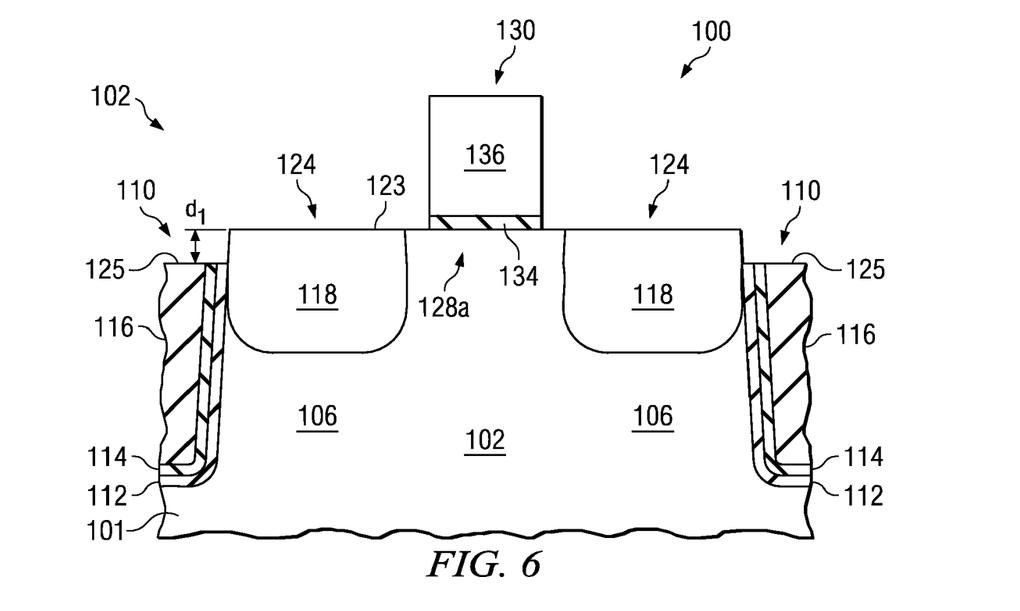
FIG. 6 shows a cross-sectional view of the semiconductor device shown in FIG. 4 rotated by ninety degrees.

FIG. 5 shows a top view of the first transistor 130 of the semiconductor device 100 shown in FIGS. 3 and 4, illustrating the gate 136 in the top view. To correlate FIG. 5 with FIGS. 3, 4, and 6, FIG. 3 shows a cross-sectional view of the device 100 in a view at 3-3 in FIG. 5; FIG. 4 shows a cross-sectional view of the device in a view at 4-4 in FIG. 4; and FIG. 6 shows a cross-sectional view of the first transistor 130 of the semiconductor device 100 shown in FIG. 4 rotated by ninety degrees and shown in a view at 6-6 in FIG. 5, for example. Sidewall spacers comprising insulating materials may be formed on the sidewalls of the gate 136 and gate dielectric 134, not shown.

Embodiments of the present invention provide novel methods of creating a step height (e.g., comprising dimension $d_1$) between the active areas of the first transistor 130 and at least portions of isolation regions 110 proximate the first transistor 130, to be described further herein. The top surface of the active area 124/128a of the first transistor 130 is elevated or recessed with respect to the top surface of the active area 126/128b of the second transistor 132, for example.

To manufacture the semiconductor device 100, referring again to FIG. 1, the workpiece 101 is provided. The workpiece 101 may include a pad oxide and a pad nitride disposed over the pad oxide, for example, not shown. Isolation regions 110 are formed in the workpiece 101 and in the pad oxide and pad nitride. The isolation regions 110 may be formed by disposing a photosensitive material and an optional hard mask (not shown) over the workpiece 101. The photosensitive material may comprise a photoresist, for example. The hard mask may comprise one, two, or more material layers. The hard mask may comprise a nitride material layer, and an oxide material layer disposed over the nitride material layer, for example. The photosensitive material and optional hard mask are patterned using lithography with a pattern for trenches, and exposed portions of a top portion of the workpiece 101 are etched away using the patterned photosensitive material and/or hard mask, patterning the top portion of the workpiece 101 with trenches. The photosensitive material and/or hard mask is then removed.

The trenches may be filled with at least an insulating material to form at least one isolation region 110. In some embodiments, the at least one isolation region 110 comprises at least one insulating liner 112 or 114 and a fill material 116 disposed over the at least one insulating liner 112 or 114.

For example, the trenches may be lined with a first liner 112, by depositing the first liner 112 over the workpiece 101 and the trenches patterned in the workpiece 101, pad oxide, and pad nitride. The first liner 112 may comprise an oxide such as silicon dioxide, for example, although other materials may also be used. An optional second liner 114 may be deposited over the first liner 112, as shown. The second liner 114 may comprise a nitride such as silicon nitride, for example, although other materials may also be used. A fill material 116 is formed over the liners 112 and 114 to fill the trenches.

The fill material 116 may comprise an insulating material such as silicon oxide, silicon nitride, or combinations thereof, for example. The fill material 116 may comprise a high density plasma (HDP) oxide or a tetra ethyl oxysilane (TEOS)-based oxide, examples. In some embodiments, the fill material 116 may comprise a semiconductive material such as silicon, which may improve stress properties of the isolation region 110, e.g., by providing a stress match for the material of the workpiece 101. The liners 112 and 114 are optional: if the fill material 116 comprises an insulating fill material, the liners 112 and 114 may not be included in the isolation regions 110, for example.

Excess portions of the fill material 116 and the optional liners 112 and 114 may be removed from over the top surface of the workpiece 101, e.g., from over the pad nitride, using an etch process and/or a chemical mechanical polish (CMP) process, for example, forming the isolation regions 110 within the top surface of the workpiece 101. The isolation regions 110 may comprise shallow trench isolation (STI) regions in some embodiments, for example, although the isolation regions 110 may alternatively comprise other types of isolation regions, such as deep trench (DT) isolation regions or field oxide regions, as examples. The isolation regions 110 may extend into the workpiece 101 about 300 nm or less in some embodiments, although alternatively, the isolation regions 110 may extend into the workpiece 101 by greater than about 300 nm, as examples.

The workpiece 101 may be planarized using a CMP process adapted to stop on the pad nitride, for example. The pad nitride and the pad oxide may then be removed using an etch process and/or CMP process. The top surface of the isolation region 110 may extend slightly above the top surface of the workpiece 101 after the pad nitride and pad oxide removal, e.g., by a few nm to about 20 nm. The isolation region 110 may be sequentially reduced in height slightly throughout the manufacturing process, e.g., by about 1 or 2 nm with each subsequent cleaning and etch process, for example, so that by the end of the manufacturing process for the transistors 130 and 132, the isolation regions 110 are substantially coplanar with the top surface of the workpiece 101, except in region 102 where a step height $d_1$ is intentionally created in accordance with embodiments of the present invention. Alternatively, the isolation regions 110 may be etched or polished using a CMP process so that they are substantially coplanar with the workpiece 101 top surface, for example. However, for purposes of discussion herein, the isolation regions 110 are shown as being substantially coplanar with portions of the top surface of the workpiece 101 other than the active areas 124/128a of the first transistor 130 in FIGS. 1, 3, 4, and 7 through 12, for example.

An isolation region 110 is disposed between the first well region 106 of the first transistor 130 and the second well region 108 of the second transistor 132, as shown. An isolation region 110 may be formed on an opposite side of the first transistor 130, e.g., on the left side in FIG. 1, to define the first active area 124/128a that comprises the source and drain regions 124 and the channel region 128a of the first transistor 130. An isolation region 110 may be formed on an opposite side of the second transistor 132, e.g., on the right side in FIG. 1, to define the active areas 126/128b that comprise the source and drain regions 126 and the channel region 128b of the second transistor 132.

At this point in the manufacturing process flow, the step height or dimension $d_1$ between the active area of the first transistor 130 and portions of isolation regions 110 proximate the first transistor 130 is formed, using one or more embodiments of the present invention, which are shown in FIGS. 7 through 12. The step height $d_1$ may be formed by elevating the top surface of the first active area 124/128a of the first transistor 130, by lowering a top surface of at least a portion of the isolation regions 110 at least proximate the first transistor 130 so that the height of the active area 124/128a of the first transistor 130 is greater or less than the height of at least portions of the isolation regions 110 proximate the first transistor 130, or by removing or lowering a top portion of the workpiece 101, e.g., the active areas 124/128a of the first transistor 130 proximate the isolation regions 110.

Figure 7:
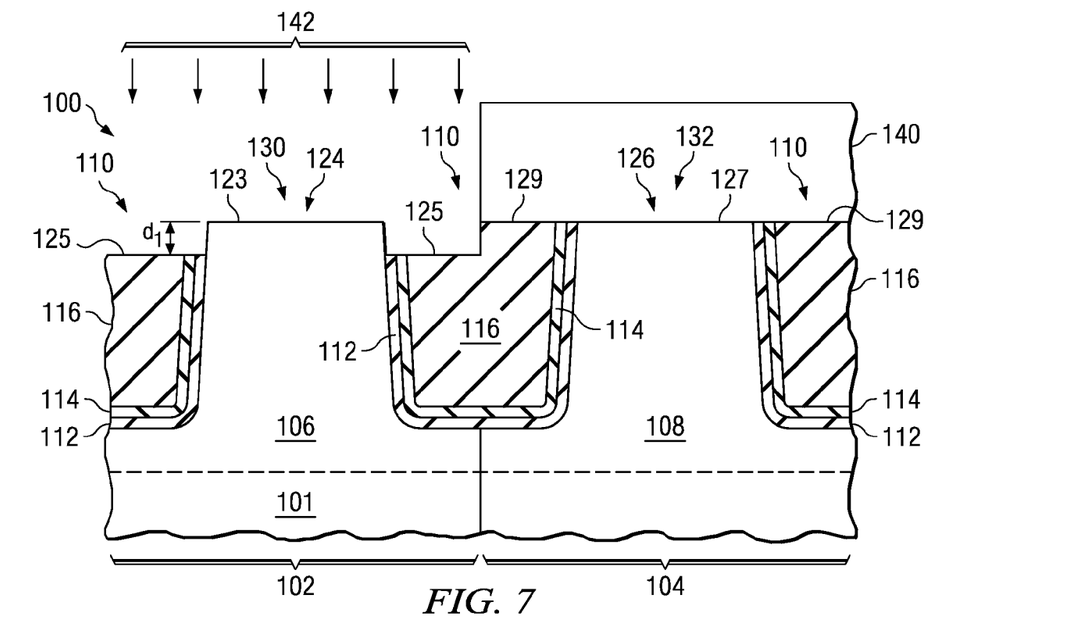
FIG. 7 is a cross-sectional view of a semiconductor device, illustrating a method of creating a step height between the active area of the first transistor and portions of isolation regions proximate the first transistor in accordance with a first embodiment of the present invention, using a masking material and an etch process to reduce the height of portions of the isolation regions proximate the first transistor.

For example, in a first embodiment of the present invention shown in FIG. 7 in a cross-sectional view, a step height comprising dimension $d_1$ is created between the active area 124/128a (e.g., the top portion of the first well region 106 and also the channel region 128a) of the first transistor 130 and portions of isolation regions 110 proximate the first transistor 130 using a masking material 140 and an etch process 142. The masking material 140 is formed over the entire workpiece 101, e.g., over the isolation regions 110 and the active areas 124/128a and 126/128b of the first transistor 130 and the second transistor 132, respectively. The masking material 140 may comprise a photosensitive material such as a photoresist, for example. The masking material 140 is patterned using lithography to remove the masking material 140 from over the first region 102, e.g., from over the active area 124/128a of the first transistor 130 and from over portions of the isolation regions 110 proximate the first transistor 130, as shown.

An etch process 142 is then used to reduce the height of or recess portions of the isolation regions 110 proximate the first transistor 130. The etch process 142 may comprise an etch process that is adapted to remove the materials 112, 114, and 116 of the isolation regions 110, but not the material 106 of the active areas 124/128a of the first transistor 130, for example. The etch process 142 may comprise a dry or wet etch process, for example. The etch process 142 may comprise a selective etch process adapted to recess the isolation region 110 proximate the first well region 106 of the first transistor 130, as another example. The etch process 142 may comprise a $C_xF_y$-based or $C_xH_yF_z$-based reactive ion etch (RIE) process or a HF-based wet etch process, as examples, although other etch chemistries may also be used.

The top surface 123 of the active area 124/128a or the first well region 106 of the first transistor 130 comprises a height that is greater than the top surface 125 of portions of the isolation regions 110 proximate the first transistor 130, as shown. The height of the top surface 123 is also referred to herein as a first height, for example. The top surface 127 of the active area 126/128b or the second well region 108 of the second transistor 132 and the top surface 129 of portions of the isolation regions 110 proximate the second transistor 132 comprise substantially the same height as the first height of the top surface 123 of the first transistor 130 in this embodiment, as shown. The top surface 125 of portions of the isolation regions 110 proximate the first transistor 130 comprises a second height, wherein the first height is greater than the second height, for example.

In some embodiments, the lithography process used to pattern the masking material 140 may utilize a dedicated lithography mask (not shown), e.g., designed specifically for patterning the masking material 140. Thus, an additional lithography mask may be required to pattern the masking material 140 before recessing portions of the isolation regions 110 proximate the first transistor 130.

In other embodiments, the lithography process used to pattern the masking material 140 may comprise or utilize a lithography mask (also not shown) used to pattern or alter another portion or element of the semiconductor device 100. The lithography mask may comprise the same mask that is used to form the first well region 106 (e.g., using dopant implantation) of the first transistor 130 in the first region 102, as one example. As another example, the lithography mask may comprise the same mask that is used to adjust a threshold voltage ($V_t$) of the first transistor 130, e.g., by implanting a material or substance into the first well region 106 of the first region 102. Alternatively, other lithography masks used to mask the second region 104 of the workpiece 101 while the first region 102 of the workpiece 101 is altered may also be used. Advantageously, no additional lithography masks are required in these embodiments, providing a cost savings.

Figure 8:
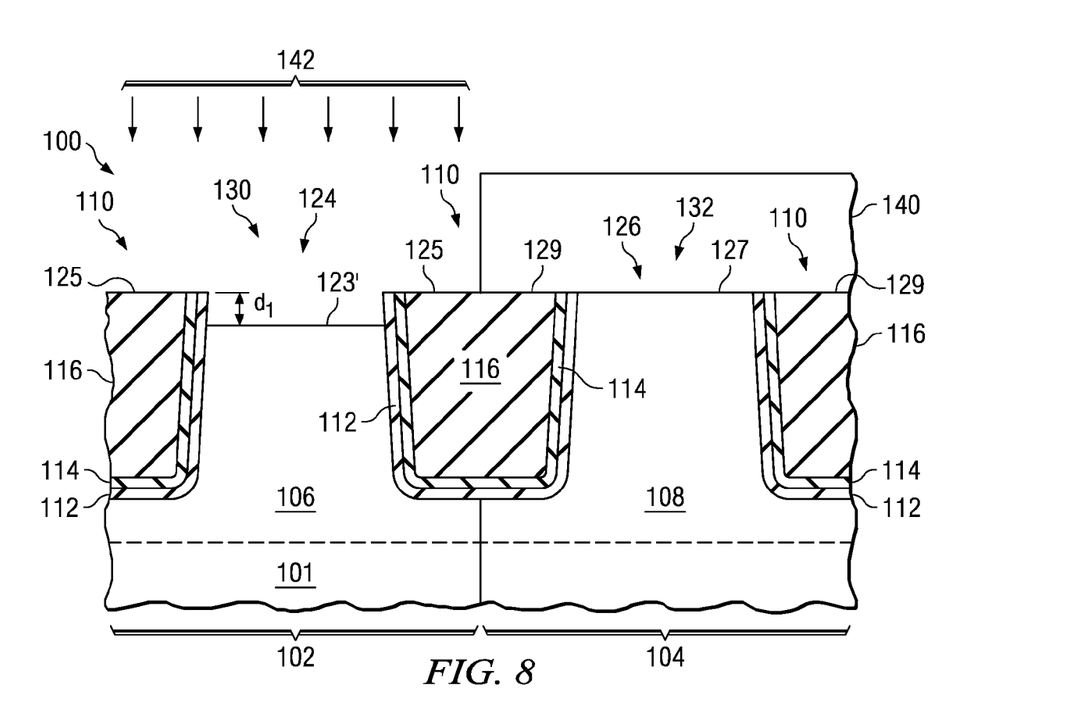
FIG. 8 is a cross-sectional view of a semiconductor device wherein the etch process shown in the embodiment of FIG. 7 is used to reduce the height of the active areas of the first transistor.

The embodiment shown in FIG. 7 may alternatively be used to recess the workpiece 101 or active area 124/128a or 126/128b (e.g., the well regions 106 or 108) of one of the transistors 130 or 132, respectively. For example, FIG. 8 shows an embodiment wherein the etch process 142 is adapted to etch the active area 124/128a comprising the well region 106 of transistor 130 in the first region 102. Alternatively, the first region 102 may be masked, and the well region 106 may be recessed using the etch process 142, for example, not shown. A top portion of the workpiece 101, e.g., the first well region 106 of the first transistor 130 is removed or lowered using the etch process 142, proximate the isolation regions 110 of the first region 102 of the workpiece 101. The top surface 123' of the well region 106 is lower than the top surface of the isolation region 125 by amount $d_1$ in this embodiment, as shown.

Figure 9:
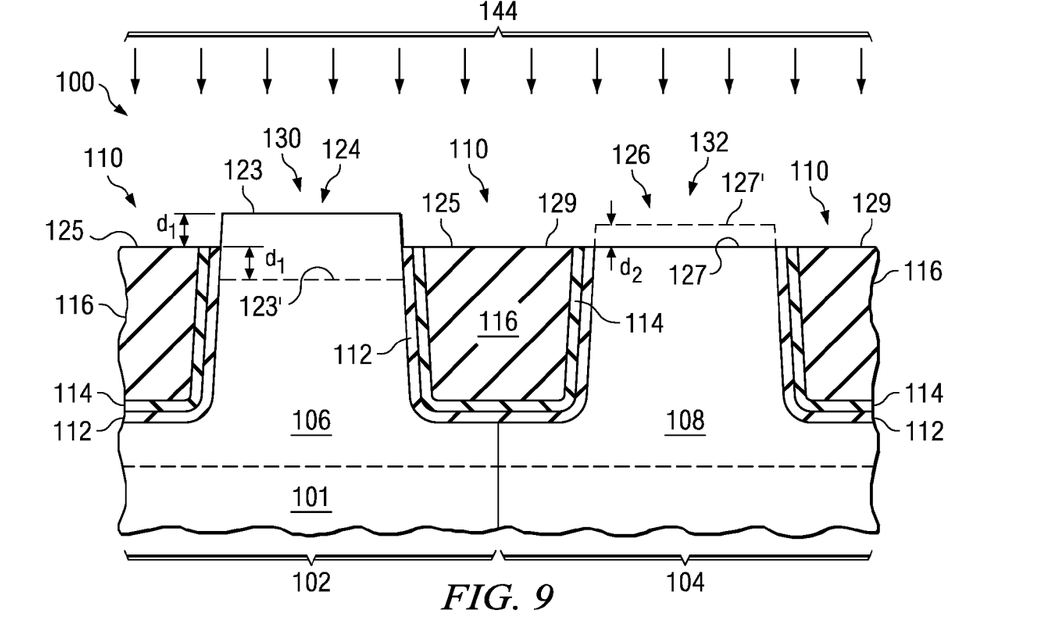
FIG. 9 is a cross-sectional view of a semiconductor device, illustrating a method of creating a step height between the active area of the first transistor and isolation regions in accordance with a second embodiment of the present invention, using a selective etch process to etch away top portions of the isolation regions and the active area of the second transistor, or to etch away top portions of the active area of the first transistor, shown in phantom.

In accordance with a second embodiment of the present invention, a selective etch process 144 may be used to recess the isolation regions 110, or alternatively, to recess the first well region 106 of the first region 102, without the use of a lithography mask. FIG. 9 shows a cross-sectional view of a semiconductor device 100, illustrating a method of creating a step height $d_1$ between the active area 124/128a of the first transistor 130 and isolation regions 110, using a selective etch process 144 to etch away top portions of the isolation regions 110 and also recessing the active area 126/128b (e.g., the upper portion of the second well region 108) of the second transistor 132. The second well region 108 of the second transistor 132 may be implanted with a different dopant material than the first well region 106 of the first transistor 130 in this embodiment. Because the second well region 108 of the second transistor 132 is implanted with a different dopant material than the first well region 106 of the first transistor 130, an etch process 144 comprising an etch selectivity of the first well region 106 to the second well region 108 may be selected, so that a masking material is not required, as in the first embodiment.

The first well region 106 of the first transistor 130 may be implanted with phosphorus (P), and the second well region 108 of the second transistor 132 may be implanted with arsenic (As), as examples. The different dopants implanted in the first well region 106 and the second well region 108 may create an etch selectivity between the first well region 106 and the second well region 108, for example, so that the second well region 108 material etches away more rapidly than the first well region 106 material using certain etch chemistries.

For example, in the embodiment shown in FIG. 9, the etch process 144 may comprise a wet etch process adapted to etch the isolation regions 110 and the second well region 108, but not the first well region 106 of the first transistor 130. If the second well region 108 is highly doped, e.g., having a doping concentration of about $10^{20}$ cm$^{-3}$, an etch selectivity of about 5:1 may be achieved using an alkaline solution of KOH, NaOH, or LiOH, as examples. Alternatively, different doping concentrations of the second well region 108 and different etch chemistries may also be used for the selective etch process 144, for example.

Furthermore, in the embodiment shown in FIG. 9, before selectively etching the second well region 108 of the second region 104 to create the step height $d_1$, the active areas 124/128a and 126/128b of both the first transistor 130 and the second transistor 132 may first be elevated, e.g., using an epitaxial growth process. Alternatively, before selectively etching the second well region 108 of the second region 104, the isolation regions 110 may be recessed, e.g., by using an etch process adapted to recess the isolation regions 110, but not the active areas 124/128a and 126/128b of the first and second transistors 130 and 132. Either the first well region 106 or the second well region 108 may be selectively etched, for example.

In the embodiment shown in FIG. 9, the top surface 123 of the active area or the first well region of the first transistor 130 comprises a first height that is greater than the top surface 125 of the isolation regions 110 proximate the first transistor 130. The top surface 123 of the active area or the first well region of the first transistor 130 comprises a first height that is also greater than the top surface 127 of the active area or the second well region of the second transistor 130 and the top surface 129 of the isolation regions 110 proximate the second transistor 132. The top surface 125 of the isolation regions 110 proximate the first transistor 130, the top surface 127 of the active area or the second well region of the second transistor 130, and the top surface 129 of the isolation regions 110 proximate the second transistor 132 comprise a second height, wherein the first height of the top surface 123 of the first transistor 130 is greater than the second height, in this embodiment.

A selective etch process 144 may alternatively be used to remove a top portion of the first well region 106, but not remove the isolation region 110 material or the second well region 108. The etch process 144 may be adapted to selectively etch or remove the first well region 106 selective to the isolation region 110 and second well region 108 in this embodiment, for example. Thus, the first well region 106 of the first transistor 130 in the first region 102 is selectively etched to create a negative step height or dimension $d_1$, as shown in phantom in FIG. 9. The top surface 123' of the first well region 106 is lower than the top surfaces of the isolation regions 125 proximate the first well region 106, and is also lower than the top surfaces 129 of the isolation regions 110 proximate the second well region 108 and lower than the top surface 127 of the second well region 108, for example.

The selective etch process 144 may be adapted to remove a top portion of the isolation regions 110 at a faster rate than the first well region 106 and second well region 108 material is removed in some embodiments. For example, the selective etch process 144 may be adapted to remove a top portion of the first well region 106 at a faster rate than the second well region 108 is removed, in some embodiments. The different etch rates in the first well region 106 in the first region 102 and the second well region 108 in the second region 104 may be achieved as a result of different dopant concentrations in the well regions 106 and 108, for example. For example, as shown in FIG. 9 in phantom, the etch process 144 may result in the second well region 108 having a top surface 127' having a height above the isolation regions 110 of an amount or dimension $d_2$, wherein dimension $d_2$ is less than (or alternatively, greater than, not shown) dimension $d_1$ of the height of the top surface 123 of the first well region 106 above the top surfaces 125 and 129 of the isolation region 110.

Figure 10:
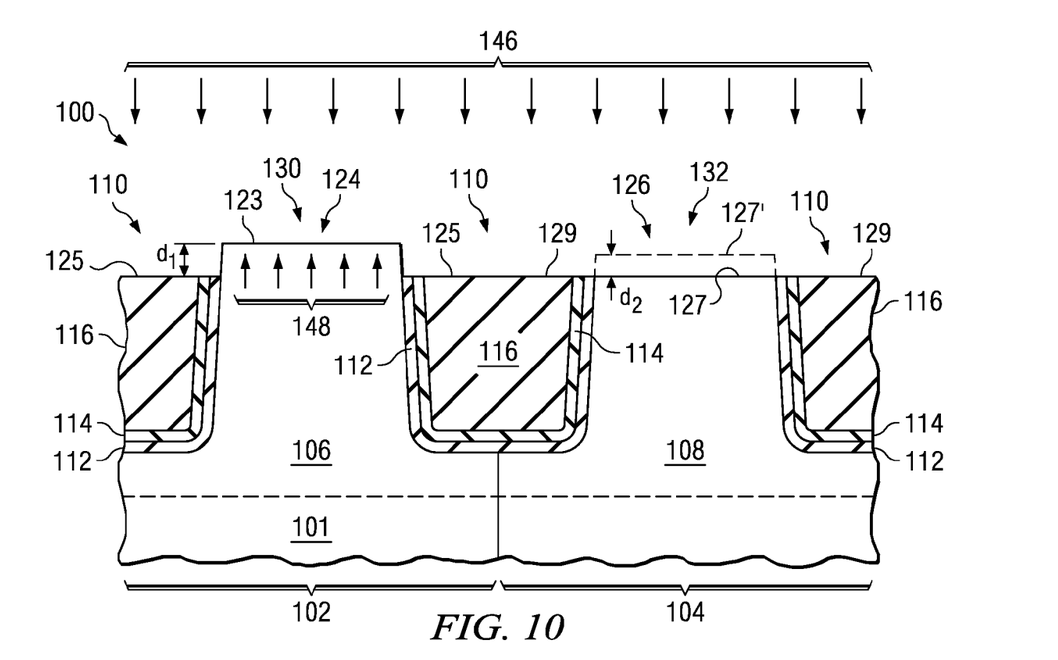
FIG. 10 is a cross-sectional view of a semiconductor device, illustrating a method of creating a step height between the active area of the first transistor and isolation regions in accordance with a third embodiment of the present invention, using a selective epitaxial growth process to increase the height of the active area of at least the first transistor.

FIG. 10 is a cross-sectional view of a semiconductor device 100, illustrating a method of creating a step height $d_1$ between the first active area 124/128a of the first transistor 130 and isolation regions 110 in accordance with a third embodiment of the present invention, using a selective epitaxial growth process 146 to increase the height of the first active area 124/128a or first well region 106 of the first transistor 130, as shown at 148.

The epitaxial growth process 146 may comprise introducing SiCl$_4$ into a processing chamber that the workpiece 101 is disposed in, and elevating the temperature to at least about 1,000 degrees C. in the presence of H$_2$ for several minutes, as an example. Alternatively, the selective epitaxial growth process 146 of the first well region 106 or active area of the first transistor 130 may comprise other chemistries, temperatures, and time periods, for example. The epitaxial growth process 146 results in the duplication of the pattern of the top surface of the first well region 106 of the first transistor 130 upwardly, as shown by the epitaxial growth at 148, creating the step height $d_1$ between the first active area 124/128a of the first transistor 130 and the isolation regions 110. Advantageously, a lithography mask and process are not required for this embodiment.

The selective epitaxial growth process 146 may be adapted to grow semiconductive material on top surfaces of the first well region 106 and the second well region 108 at different growth rates. The different growth rates in the first well region 106 in the first region 102 and the second well region 108 in the second region 104 may be achieved using different dopant concentrations in the well regions 106 and 108. For example, as shown in FIG. 10 in phantom, the epitaxial growth process 146 may be adapted to increase the height or top surface 127' of the second well region 108 by an amount or dimension $d_2$, wherein dimension $d_2$ is less than (or alternatively, greater than, not shown) dimension $d_1$ of the height or top surface 123 of the first well region 106 above the top surfaces 125 and 129 of the isolation region 110.

In the embodiment shown in FIG. 10, before the selective epitaxial growth process 146, the top surfaces 125 and 129 of the isolation regions 110 may be elevated above the top surfaces of the first and second well regions 106 and 108, not shown, e.g., by an amount substantially equal to a thickness of a pad nitride disposed over the workpiece 101 during the fabrication of the isolation regions. The first and second well regions 106 and 108 may be recessed using an etch process, and then the selective epitaxial growth process 146 may be performed. The isolation regions 110 may later optionally be recessed using an etch process adapted to etch the isolation regions 110 but not the first or second well regions 106 and 108. Or, alternatively, the isolation regions 110 may be gradually and sequentially reduced in height by various cleaning processes and/or etch processes used to fabricate the semiconductor device 100 in subsequent manufacturing steps.

Figure 11:
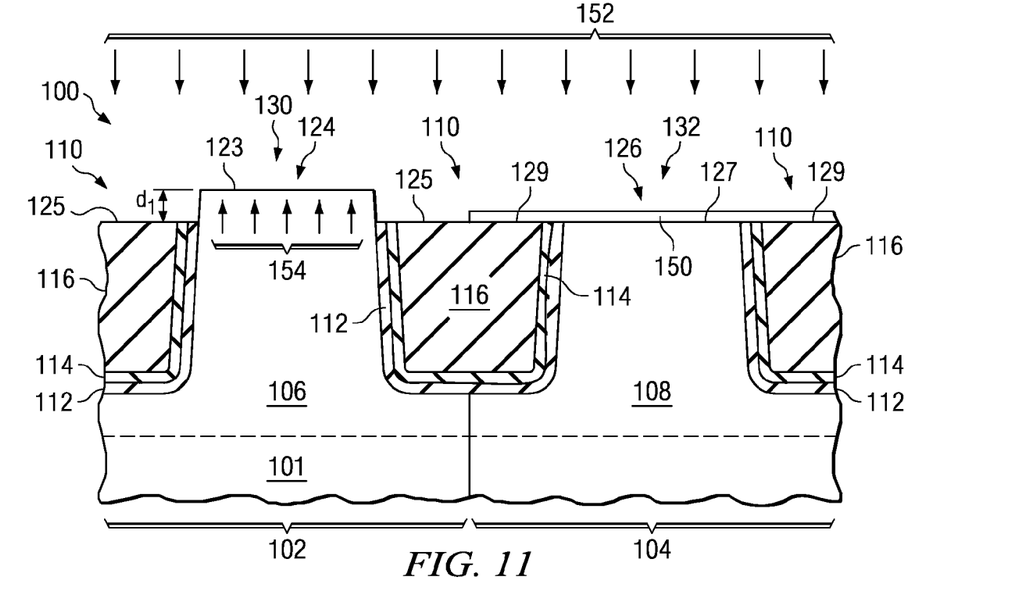
FIG. 11 is a cross-sectional view of a semiconductor device, illustrating a method of creating a step height between the active area of the first transistor and isolation regions in accordance with a fourth embodiment of the present invention, using a masking material to cover the second transistor and an epitaxial growth process to increase the height of the active areas of the first transistor.

FIG. 11 is a cross-sectional view of a semiconductor device 100, illustrating a method of creating a step height $d_1$ between the active area 124/128a of the first transistor 130 and portions of isolation regions 110 proximate the first transistor 130 in accordance with a fourth embodiment of the present invention, using a masking material 150 to cover the second transistor 132 in the second region 104 of the workpiece 101 and using a selective epitaxial growth process 152 to increase the height of the active areas 124/128a of the first transistor 130.

The masking material 150 may comprise a hard mask including a nitride material, an oxide material, or combinations and/or multiple layers thereof, as examples, although alternatively, the masking material 150 may comprise other materials. The masking material 150 may be patterned using a dedicated lithography mask, or alternatively, the masking material 150 may be patterned using a lithography mask used to pattern or alter the first region 102 of the workpiece 101 in other manufacturing process steps, as described with reference to the embodiment shown in FIG. 7.

The masking material 150 protects the active area 126/128b of the second transistor 132, preventing growth or elevation of the active area 126/128b or second well region 108 of the second transistor 132. The selective epitaxial growth process 152 may comprise similar chemistries, temperatures, and time periods as described for epitaxial growth process 146 of FIG. 10, for example. After the top surface 123 of the active area 124/128a in the first region 102 is elevated, the masking material 150 is removed. The masking material 150 may be removed during a pre-cleaning step before a gate oxide such as gate dielectric 134 shown in FIG. 4 is deposited, for example.

The epitaxial growth process 152 results in the duplication of the pattern of the top surface of the first well region 106 of the first transistor 130 upwardly, as shown by the epitaxial growth at 154, creating the step height comprising dimension $d_1$ between the active area 124/128a of the first transistor 130 and the isolation regions 110 proximate the active areas 124/128a of the first transistor 130.

Figure 12:
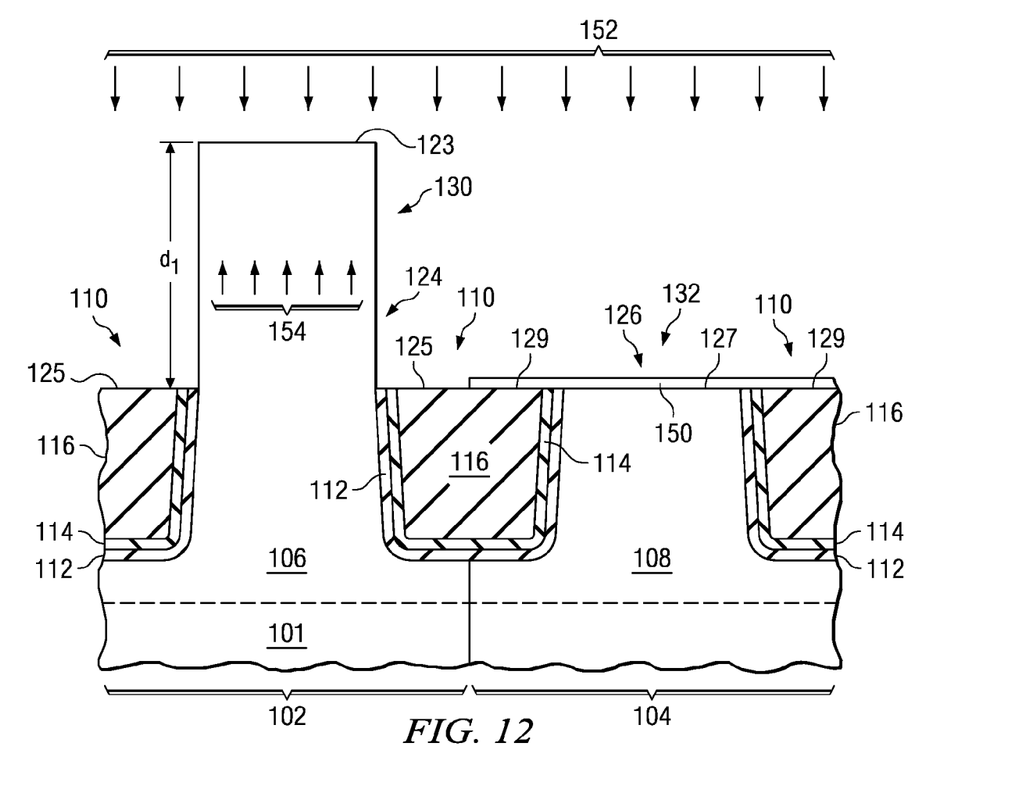
FIG. 12 shows the embodiment of FIG. 11, wherein the epitaxial growth process is used to form a multiple gate transistor in the first region of the workpiece.

The fourth embodiment shown in FIG. 11 is particularly advantageous in some applications, because the epitaxial growth process 152 may be used to form a multiple gate transistor 130 in the first region 102 of the workpiece 102, as shown in FIG. 12 in a cross-sectional view. Because the second region 104 of the workpiece 101 is masked with the masking material 150, a 1:0 epitaxial growth rate is achieved (e.g., there is no growth at all in the second region 104), so that the epitaxial growth process 152 may be continued for a longer period of time to achieve a relatively large dimension $d_1$ above the top surface 125 of the isolation regions 110. Dimension $d_1$ may comprise hundreds of nm or several μm, for example, in some embodiments. Dimension $d_1$ may be designed based on the requirements of the multiple gate transistor 130 to be formed, for example. Thus, one or more multiple gate transistors 130 may be formed in the first region 102 on the same workpiece 101 that planar transistors 132 are formed in the second region 104.

As in the other embodiments described herein, the channel regions 128a of the active areas 124/128a are also elevated (not shown) with respect to portions of the isolation regions 110 proximate the active areas 124/128a using the epitaxial growth process 152, as can be seen in the view shown in FIG. 6.

The multiple gate transistors 130 of FIG. 12 may comprise FinFET devices wherein gates may be formed over two sidewalls of the elevated channel region 128a, for example. The multiple gate transistors 130 may also comprise tri-gate devices wherein gates are formed over the sidewalls and the top surface of the elevated channel region 128a. The multiple gate transistors 130 may also comprise other multiple gate devices having more than one gate, for example.

The other embodiments described herein with respect to FIGS. 7 through 11 may also be used to form elevated active regions 124/128a of multiple gate transistors 130, resulting in a structure shown in FIG. 12 having substantially and/or extremely elevated active regions 124/128a, for example.

In the embodiments shown in FIGS. 9 through 12, the top surface 123' of the active area 124/128a (e.g., only the first well region 106 of the active area 124/128a is shown in the views of FIG. 9 through 12) of the first transistor 130 may comprise a first height that is greater than the top surface 125 of the isolation regions 110 proximate the first transistor 130. The top surface 123' of the active area 124/128a of the first transistor 130 may also comprise a height that is greater than the top surface 127 of the active area 126/128b of the second transistor 130 and the top surface 129 of the isolation regions 110 proximate the second transistor 132. The top surface 125 of the isolation regions 110 proximate the first transistor 130, the top surface 127 of the active area 126/128b of the second transistor 132, and the top surface 129 of the isolation regions 110 proximate the second transistor 132 may comprise a second height, wherein the first height of the top surface 123' of the active area 124/128a of the first transistor 130 is greater than the second height, in these embodiments.

In the embodiments shown in FIG. 8 and in FIG. 9 in phantom, the top surface 123 of the active area 124/128a (e.g., only the first well region 106 of the active area 124/128a is shown in the views of FIG. 9 through 12) of the first transistor 130 may comprise a first height that is less than the top surface 125 of the isolation regions 110 proximate the first transistor 130. The top surface 123 of the active area 124/128a of the first transistor 130 may also comprise a height that is less than the top surface 127 of the active area 126/128b of the second transistor 130 and the top surface 129 of the isolation regions 110 proximate the second transistor 132. The top surface 125 of the isolation regions 110 proximate the first transistor 130, the top surface 127 of the active area 126/128b of the second transistor 130, and the top surface 129 of the isolation regions 110 proximate the second transistor 132 may comprise a second height, wherein the first height of the top surface 123 of the active area 124/128a of the first transistor 130 is less than the second height, in these embodiments.

Two or more of the methods described herein with reference to FIGS. 7 through 12 may be used to create the step height $d_1$ between the active area of the first transistor 130 and at least portions of isolation regions 110 proximate the first transistor 130 in accordance with embodiments of the present invention. The methods described herein may be integrated to optimally tune step heights $d_1$ between active area of first transistors 130 and at least portions of isolation regions 110 proximate the first transistors 130, while avoiding degrading, altering, or affecting the performance of the second transistors 132, because a step height is not formed proximate the active areas 126/128b of the second transistors 132, in some embodiments, or because less of a step height is formed proximate the active areas 126/128b of the second transistors 132 than step height $d_1$ of the active areas 124/128a of the first transistors 130, in other embodiments, as shown in phantom in FIGS. 9 and 10 at $d_2$.

For example, a method of manufacturing a semiconductor device 100 may comprise forming at least one of the plurality of isolation regions 110 in the first region 102 and in the second region 104 of the workpiece 101. The first active area 124/128a of the first transistor, the second active area 126/128b of the second transistor 132, and the plurality of isolation regions 110 may be substantially coplanar as initially formed, for example. Alternatively, the plurality of isolation regions 110 may initially be slightly elevated above the top surfaces of the first well regions 106 and the second well region 108, for example, not shown. The method may include the steps of: a) masking the second region 104 of the workpiece 101, and then removing top portions of the plurality of isolation regions 110 proximate the first active area 124/128a, as shown in FIG. 7; b) masking the second region 104 of the workpiece 101, and then removing top portions of the first active area 124/128a, as shown in FIG. 8; c) selectively etching away a top portion of the plurality of isolation regions 110 and the second active area 126/128b, as shown in FIG. 9; d) selectively etching away a top portion of the plurality of isolation regions 110 and the second active area 126/128b, decreasing the height of the first active area 124/128a to the first height by a first amount and decreasing a height of the second active area 126/128b by a second amount, wherein the second amount is less than the first amount, as shown in FIG. 9 in phantom at 127'; e) selectively etching away a top portion of the first active area 124/128a, as shown in phantom in FIG. 9 at 123'; f) increasing a height of the first active area 124/128a to the first height using a selective epitaxial growth process 146, as shown in FIG. 10; g) increasing the height of the first active area 124/128a to the first height by a first amount and increasing a height of the second active area 126/128b by a second amount using a selective epitaxial growth process 146, wherein the second amount is less than the first amount, as shown in FIG. 10 in phantom at 127'; h) masking the second region 104 of the workpiece 101 and increasing a height of the first active area 124/128a to the first height using an epitaxial growth process, as shown in FIGS.

11 and 12; or i) a combination of at least two of the steps a), b), c), d), e), f), g), or h) described above, for example.

After the embodiments of the present invention shown and described in FIGS. 7 through 12, processing of the semiconductor device 100 is then continued to complete the fabrication process. For example, referring again to FIGS. 3 through 6, a gate dielectric material 134 may be deposited or formed over the workpiece 101, and a gate material 136 may be deposited over the gate dielectric material 134. The gate dielectric material 134 may comprise an oxide material, a nitride material, silicon oxide, or a high dielectric constant (k) material having a dielectric constant of greater than about 3.9, as examples. The gate material 136 may comprise a conductive material such as a semiconductive material or a metal, as examples. Alternatively, the gate dielectric material 134 and the gate material 136 may comprise other materials.

The gate material 136 and the gate dielectric material 134 may be patterned, e.g., using lithography to form a gate 136 and a gate dielectric 134 of the transistors 130 and 132. Sidewall spacers (not shown) comprising an insulating material may be formed over sidewalls of the gate 136 and the gate dielectric 134, and the well regions 106 and 108 may be implanted with dopants to form semiconductive regions 118 and 120 of the source and drain regions 124 and 126 of the first and second transistors 130 and 132, respectively. For example, if the first transistor 130 comprises a PFET and the second transistor 132 comprises an NFET, a source and drain region 124 comprising a p+ region 118 may be formed in the workpiece 101 of the first transistor 130, and a source and drain region 126 comprising an n+ region 120 may be formed in the workpiece 101 of the second transistor 132. The source and drain regions 124 and 126 may alternatively be formed by etching trenches in the workpiece 101 and filling the trenches with a semiconductive material 118 or 120, for example. The semiconductive regions 118 and 120, and/or the gates 136 may be silicided, by forming a metal layer over the workpiece 101 and heating the workpiece 101, causing a portion of the atoms proximate the top surface of the semiconductive regions 118 and 120 and/or the gates 136 to combine with the metal of the metal layer, forming the silicide. Any excess remaining metal layer is then removed, leaving a top surface of a portion of the active area 124/128a of the first transistor 130 and/or a top surface of a portion of the active area 126/128b of the second transistor 132 comprising a silicide, not shown.

An insulating material may be formed over the workpiece 101, and vias or contacts may be formed in the insulating material to make electrical contact to portions of the first and second transistors 130 and 132, e.g., the source and drain regions 124 and 126 of transistor 130 and 132, respectively, and/or the gate 136 regions. Conductive lines or contact pads may be coupled to and formed over the vias or contacts, not shown.

Embodiments of the present invention achieve technical advantages by providing novel structures for semiconductor devices 100 and novel methods of manufacture thereof. Embodiments of the present invention may be used to elevate or recess active areas 124/128a of one or more transistors 130 in a first region 102, but not other transistors 132 in a second region 104 of a workpiece 101. In other embodiments, a different step height $d_1$ is formed in the first region 102 than is formed in the second region 104, as shown in phantom at $d_2$ in FIGS. 9 and 10. Three or more regions 102 or 104 may also be manufactured, wherein different amounts of elevated or recessed active areas 124/128a are formed in each region 102 or 104, for example.

A plurality of different types of transistors 130 and 132 may be manufactured in a plurality of first regions 102 or second region 104, for example. Transistors 130 and 132 comprising PFETs, NFETs, multiple gate transistors, high voltage transistors, low voltage transistors, and transistors having a variety of operating characteristics such as various current ratings, threshold voltages, and other parameters, may be formed in a plurality of the regions 102 and 104. The elevation or recess of the active areas 124/128a, e.g., the step heights $d_1$ and $d_2$, of the various transistors 130 and 132 across the workpiece 101 may be varied according to the requirements for each type of transistor 130 and 132, advantageously. Thus, embodiments of the present invention provide several methods of "tuning" the step heights $d_1$ and $d_2$ between active areas 124/128a and 126/128b and portions of isolation regions 110 proximate the active areas 124/128a and 126/128b according to the transistor 130 or 132 type.

One or more regions 102 may be formed on a semiconductor device 100 that have a positive or negative step height $d_1$. A plurality of regions 102 having different step heights $d_1$ on a semiconductor device 100 may also be formed. Different step heights $d_1$ may be formed for transistors 130 in a plurality of regions 102 across a surface of a workpiece 101, depending on the transistor 130 requirements, for example, optimizing performance of many or all types of transistors 130 on a semiconductor device 100.

In some applications, the first transistors 130 in the first regions 102 described herein may comprise PFETs, as an example. In some applications, the first transistors 130 comprising the step height $d_1$ may comprise high voltage transistors, as another example. The first transistors 130 may comprise high voltage devices that are adapted to operate at a voltage of about +/−3.0 V or greater, for example. In some embodiments, the first transistors 130 may comprise low voltage transistors, as yet another example. The first transistors 130 may comprise low voltage devices that are adapted to operate at voltage levels of less than about +/−3.0 V, for example. Alternatively, the first transistors 130 may comprise other types of transistor devices than PFETs, such as NFETs, FinFETs, tri-gate FETs, other transistors, or static random access memory (SRAM) devices or other devices.

Embodiments of the present invention also include methods of manufacturing semiconductor devices 100 comprising CMOS devices and other types of devices manufactured using the methods described herein. For example, in one embodiment, a CMOS device 100 includes a workpiece 101, and a first transistor 130 comprising a PFET 130 is disposed on the workpiece 101. The PFET 130 includes a first active area 124/128a in the workpiece 101 having a first height 123. A second transistor 132 comprising an NFET 132 is also disposed on the workpiece 101 proximate the PFET 130, wherein the NFET 132 includes a second active area 126/128b. At least one isolation region 110 is disposed in the workpiece 101 proximate the PFET 130 and the NFET 132, at least a portion of the at least one isolation region 110 having a second height at least proximate the PFET 130, wherein the first height is greater than or less than the second height.

In another embodiment, a method of manufacturing a semiconductor device 100 comprising a CMOS device includes providing the workpiece 101, forming the PFET 130 in the first region 102, and forming the NFET 132 in the second region 104. The method includes forming a plurality of isolation regions 110 in the workpiece 101 proximate the PFET 130 and the NFET 132, at least a portion of the plurality of isolation regions 110 having a second height at least proximate the PFET 130, wherein the first height of the active area of the PFET 130 is greater than the second height.

Advantages of embodiments of the present invention include providing novel methods of elevating active areas of one or more types of transistors such as first transistors 130 described herein, while not elevating active areas of other types of transistors such as second transistors 132. Advantageously, the amount of the isolation region 110 recess (or elevation) may be tuned for the particular types of transistor 130 and 132 to achieve an amount of junction leakage for each type of transistor 130 or 132. A step height $d_1$ may be created in some transistors 130 but not in other transistors 132, using one or more of the methods described herein.

For example, higher performance CMOS devices may be fabricated using the methods described herein. As one example, PFETs 130 with improved performance may be achieved by recessing at least portions of isolation regions 110 proximate the PFETs 130. The effective gate 136 width $W_{\it eff}$, e.g., measured electrically, of the PFETs 130 may be increased or maximized due to the step height $d_1$ created by the increased amount of gate 136 material that is formed proximate the elevated active area. The "on" current $I_{on}$ of the PFETs 130 may be increased as a result of the increased effective gate 136 width $W_{\it eff}$, increasing the performance of the PFETs 130.

A high leakage current of transistors such as NFETs 132, which may have a high amount of junction leakage, particularly if an isolation region 110 proximate the NFETs 132 were to be recessed, is avoided by embodiments of the present invention, by not recessing isolation regions 110 proximate the NFETs 132. Optimization between performance of the PFETs 130 and leakage current of NFETs 132 can thus be achieved by embodiments of the present invention described herein. Embodiments of the present invention advantageously allow separate tunability of isolation region 110 recesses to active areas for PFETs 130 and NFETs 132.

In other embodiments, shown in phantom at 127' in FIGS. 9 and 10, a greater step height is formed in the active areas 124/128a of the first transistors 130 in the first region 102 than in the step height formed in the active areas 126/128b of the second transistors 132 in the second region 104, for example. For example, the step height of the first active areas 124/128a comprises a dimension $d_1$ that is greater than the step height of the second active areas 126/128b comprising dimension $d_2$. The difference between dimensions $d_1$ and $d_2$ may comprise several nm or more, for example. Thus, embodiments of the present invention provide novel semiconductor device 100 designs and manufacturing methods wherein active areas 124/128a of some transistors 130 protrude more away from top surfaces of isolation regions 110 than active areas 126/128b of other transistors 132 protrude away from the top surfaces of the isolation regions 110, for example.

After the manufacturing process steps described herein with respect to FIGS. 7 through 12, subsequent cleaning processes and/or etch processes may result in the top surfaces of the isolation regions 110 being lowered slightly. Thus, all of the embodiments described herein may result in semiconductor device 100 designs and manufacturing methods wherein active areas 124/128a of some transistors 130 protrude more away from top surfaces of isolation regions 110 than active areas 126/128b of other transistors 132 protrude away from the top surfaces of the isolation regions 110, for example, which may be an advantage in some applications, because siliciding of top surfaces of the active areas 124/128a and/or 126/128b is facilitated.

Optimization of performance of different types or groups of first transistors 130 and second transistors 132 is achievable using embodiments of the present invention described herein. Embodiments of the present invention advantageously allow separate tunability of isolation region 110 recesses or elevated areas to active areas 124/128a and 126/128b of first transistors 130 and second transistors 132 in multiple regions 102 and 104 across a surface of a workpiece 101. Some regions 102 may be treated and processed using the methods described herein differently than regions 104 are treated and processed, allowing the ability to select certain groups of types of transistors and devices wherein the active areas of the transistors and devices (e.g., in regions 102) are elevated or recessed with respect to the active areas of transistors or devices in regions 104.

The novel semiconductor devices 100, CMOS devices, and manufacturing methods described herein are easily and inexpensively implementable into manufacturing process flows for semiconductor devices 100. For example, the novel methods and structures described herein may easily be implemented into existing manufacturing process flows, lithography mask designs, and lithography tools and systems, with few additional processing steps being required for implementation of the invention.

Embodiments of the present invention also provide novel methods of forming one or more three-dimensional multiple gate transistors in some regions 102 of a workpiece 101, as shown in FIG. 12. The multiple gate transistors 130 comprise vertical active areas 124/128a, for example. The multiple gate transistors 130 may be formed in some regions, but not other regions 104, of a workpiece 101. Alternatively, the multiple gate transistors may be fabricated over an entire workpiece 101, for example. Thus, FinFETs and other 3D multi-gate transistors may be formed on the same chip as planar transistors 132 are formed, advantageously.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
    a first transistor comprising a channel region at a top surface of a first active area;
    a second transistor comprising a channel region at a top surface of a second active area, wherein the top surface of the first active area is elevated or recessed with respect to the top surface of the second active area; and
    an isolation region disposed between the first transistor and the second transistor, a top surface of the isolation region being planar between the first and the second active areas, wherein the top surface of the second active area is elevated or recessed with respect to the top surface of the isolation region by a different amount than the top surface of the first active area is elevated or recessed with respect to the top surface of the isolation region, and wherein the top surface of the second active area of the second transistor is elevated or recessed with respect to an entire top surface of the isolation region.

2. The semiconductor device according to claim 1, wherein the top surface of the first active area of the first transistor is elevated or recessed with respect to an entire top surface of the isolation region.

3. The semiconductor device according to claim 1, wherein the first transistor device comprises a multiple gate transistor, wherein a plurality of gates are disposed over a portion of the first active area of the multiple gate transistor.

4. The semiconductor device according to claim 1, wherein the top surface of a portion of the first active area of the first transistor or the top surface of a portion of the second active area of the second transistor comprises a silicide.

5. The semiconductor device according to claim 1, wherein the semiconductor device comprises at least one first transistor and at least one second transistor, wherein the at least one second transistor comprises a different type of transistor than the at least one first transistor.

6. The semiconductor device according to claim 1, wherein the first transistor comprises a PMOS transistor and the second transistor comprises a NMOS transistor, wherein the first transistor comprises a multi-gate transistor, and wherein the second transistor comprises a single gate transistor.

7. A complementary metal oxide semiconductor (CMOS) device, comprising:
a workpiece;
a p channel metal oxide semiconductor (PMOS) field effect transistor (PFET) having a first channel region disposed on the workpiece, the PFET comprising a first active area in the workpiece having a first height at the first channel region;
an n channel metal oxide semiconductor (NMOS) field effect transistor (NFET) having a second channel region disposed on the workpiece proximate the PFET, the NFET comprising a second active area, wherein the second active area of the NFET comprises a second height at the second channel region; and
at least one isolation region disposed in the workpiece between the PFET and the NFET, the at least one isolation region having a third height, wherein the first height is greater than the third height, and wherein the second height is greater than the third height and less than the first height, wherein the third height is uniform between the first and the second active areas.

8. The CMOS device according to claim 7, wherein the at least one isolation region comprises at least one insulating liner and a fill material disposed over the at least one insulating liner, or wherein the at least one isolation region comprises an insulating fill material.

9. The CMOS device according to claim 8, wherein the at least one isolation region comprises the at least one insulating liner and the fill material disposed over the at least one insulating liner, wherein the at least one insulating liner comprises an oxide material layer, a nitride material layer, or combinations or multiple layers thereof, or wherein the fill material comprises an insulator or a semiconductive material.

10. A semiconductor device, comprising:
a p channel metal oxide semiconductor (PMOS) transistor comprising a channel region at a top surface of a first active area;
a n channel metal oxide semiconductor (NMOS) transistor comprising a channel region at a top surface of a second active area, wherein the top surface of the first active area is elevated or recessed with respect to the top surface of the second active area; and
an isolation region disposed between the PMOS transistor and the NMOS transistor, a top surface of the isolation region being planar between the first and the second active areas, the isolation region comprising a insulating liner and a semiconductor fill material disposed over the insulating liner, wherein the top surface of the second active area of the NMOS transistor is elevated with respect to the top surface of the isolation region by a different amount than the first active area of the PMOS transistor is elevated with respect to the top surface of the isolation region.

11. The semiconductor device according to claim 10, wherein the top surface of a portion of the first active area of the PMOS transistor or the top surface of a portion of the second active area of the NMOS transistor comprises a silicide.

12. The semiconductor device according to claim 10, wherein the PMOS transistor comprises a multi-gate transistor, and wherein the NMOS transistor comprises a single gate transistor.

* * * * *